United States Patent [19]
Beery et al.

[11] 3,946,285
[45] Mar. 23, 1976

[54] SOLENOID CONTROL SYSTEM WITH CUSP DETECTOR

[75] Inventors: Jack Beery, Farmington; Daniel A. Wisner, Milan, both of Mich.

[73] Assignee: Burroughs Corporation, Detroit, Mich.

[22] Filed: Feb. 18, 1975

[21] Appl. No.: 550,597

[52] U.S. Cl. .................................................. 317/123
[51] Int. Cl.² .................................................. H01F 7/18
[58] Field of Search ................ 317/123, DIG. 5, 157

[56] References Cited
UNITED STATES PATENTS

| | | | |
|---|---|---|---|
| 3,398,328 | 8/1968 | Piekarski | 317/157 |
| 3,671,814 | 6/1972 | Dick | 317/123 |
| 3,803,456 | 4/1974 | Myers | 317/123 |

*Primary Examiner*—R. N. Envall, Jr.
*Attorney, Agent, or Firm*—Charles P. Padgett, Jr.; Edwin W. Uren

[57] ABSTRACT

A solenoid control system wherein the duration of actuation of a solenoid is a function of the workload imposed thereon so that the current to the solenoid is always turned off as soon as the solenoid plunger or armature is seated. Solenoid control logic responds to an external demand for the energization of the solenoid and enables a solenoid drive circuit which supplies current to the solenoid coil. The level of current builds in the solenoid coil until the solenoid plunger or armature is pulled in. The current continues to build as the solenoid plunger or armature is drawn in until that point at which the reluctance of the magnetic circuit is changing faster than the current in the solenoid coil is able to build. From this point until the solenoid plunger is seated, the current drops. As soon as seating has occurred, the reluctance ceases to change and the current once again begins to build in the solenoid coil. The change in reluctance and the termination of that change is represented by a cusp in the waveform of the current through the solenoid coil. A broad band cusp detector senses the point at which this change in reluctance ceases (i.e., when the solenoid plunger or armature seats) and generates a pulse which is supplied to solenoid control logic causing it to disable the solenoid drive circuit and turn off or reduce the current to the solenoid coil. The solenoid control logic further insures that the solenoid drive circuit is disabled in the event that the cusp-indicative pulse does not occur within a predetermined interval of time so as to conserve energy and protect the solenoid and associated circuitry.

24 Claims, 6 Drawing Figures

$I = \dfrac{V}{R}$

SOLENOID CONTROL SYSTEM WITH CUSP DETECTOR

BACKGROUND OF THE INVENTION

This invention relates generally to solenoid control systems and to a cusp detector for use therein. More particularly, this invention relates to a solenoid control system wherein the duration of energization of the solenoid is a function of the workload imposed thereon such that the solenoid is always turned off or the current reduced as soon as the solenoid armature or plunger is seated.

The prior art is replete with examples of electromechanical systems employing electrical solenoids and solenoid control systems. Many printer systems employ solenoid-actuated print hammers; record card feeding devices employ solenoid-operated pickers; and card or check sorters employ solenoid-operated pocket gates.

Many of the solenoid control systems of the prior art have de-energized the solenoid in one or more of the following ways. Most of the systems of the prior art operate to turn off the solenoid at a fixed time after the solenoid is initially turned on. Other types of systems employ mechanical feedback such as relatively slow reacting mechanical switches which sense when the solenoid is seated and operate to de-energize the coil. Still other systems employ photo-optical devices or the like to sense the actual position of the solenoid plunger so as to de-energize the coil when the plunger reaches a predetermined physical position. A few of the systems of the prior art utilize comparison means which determine when a predetermined threshold level of current is reached after the solenoid has seated and then de-energize the solenoid coil.

All of the above-cited systems of the prior art suffer from one or more of the following disadvantages. None of these systems turn off the solenoid at substantially the exact time at which the solenoid seats, resulting in wasted energy since the solenoid continues to be driven after the plunger or armature has seated. This results in greatly increasing the power supply requirements of the system and in the possible generation of excess heat which can damage the solenoid coil or associated circuitry. In addition, the heat which is generated after the plunger has seated, in addition to wasting energy and possibly harming the coil, also reduces the effectiveness of the solenoid by increasing its resistance. Still another disadvantage of many of the systems of the prior art results from the fact that the exact position of the solenoid plunger with respect to the time of the turnoff can vary thereby making it exceedingly difficult to control the damping of the solenoid so as to achieve repeatable damping characteristics. The problem of wasted energy is particularly important in situations in which power supply requirements are critical.

SUMMARY OF THE INVENTION

It is in an object of this invention to provide a solenoid control system for minimizing power consumption and for minimizing the heat generated in a solenoid.

It is a further object of the present invention to provide a solenoid control system wherein the duration of actuation of a solenoid is a function of the workload imposed thereon.

It is still a further object of the present invention to provide a solenoid control system wherein the solenoid is deactuated at a predetermined position of the plunger so as to reduce the power requirements of the system, to reduce generated heat and the damage resulting therefrom, and to allow for controlled damping.

It is yet a further object of the present invention to provide a solenoid control system having improved repeatable damping characteristics and having better drop-out characteristics at an earlier time.

It is still a further object of the present invention to provide a solenoid control system for use in a battery operated solenoid utilization system which provides for the maximum conservation of a battery's energy by insuring the earliest possible turn-off time of the solenoid after the desired work has been accomplished.

It is yet a further object of the present invention to provide a cusp detector circuit for detecting an abrupt change or fluctuation in the current flowing through a solenoid coil which results from a rapid change in reluctance.

It is still a further object of the present invention to provide a cusp detector which monitors the current through a resistor connected in a series with a solenoid coil for generating a cusp-indicative pulse at that point in the current waveform at which the solenoid plunger or armature seats.

It is yet another object of the present invention to provide a solenoid control system employing a cusp-detector for detecting the point at which the solenoid plunger seats for controlling the turn-off time of the solenoid and responsive to the solenoid plunger not having seated within a predetermined interval of time for de-energizing the solenoid coil to prevent damage to the system.

These and other objects of the present invention are accomplished in a solenoid control system for normally de-energizing the solenoid coil at that point in time at which the solenoid plunger is seated. A cusp-detector circuit monitors the current through a sensing resistor which is connected in series with the solenoid coil and senses changes in the current building in the coil as the reluctance of the coil changes. As soon as the solenoid armature or plunger is seated and the reluctance is no longer changing, the cusp-detector circuit generates a pulse, and the solenoid control logic responds to this cusp-indicative pulse to turn off the current to the solenoid coil. In the event that the solenoid control logic does not receive a cusp-indicative pulse within a predetermined period of time, the solenoid control logic will de-energize the solenoid coil to prevent damage to the system.

BRIEF DESCRIPTION OF THE DRAWINGS

Other objects, advantages and features of this invention will become more fully apparent from the following detailed description, appended claims and accompanying drawings in which like reference numerals designate corresponding parts:

DETAILED DESCRIPTION OF THE INVENTION

Figure 1:
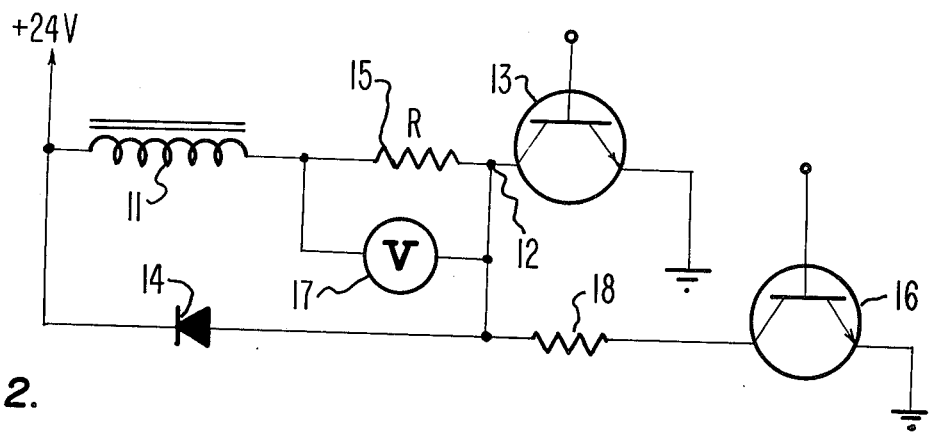
FIG. 1 shows a schematic diagram of a solenoid energization circuit having a voltmeter connected across a resistor in series with the solenoid coil.
Figure 2:
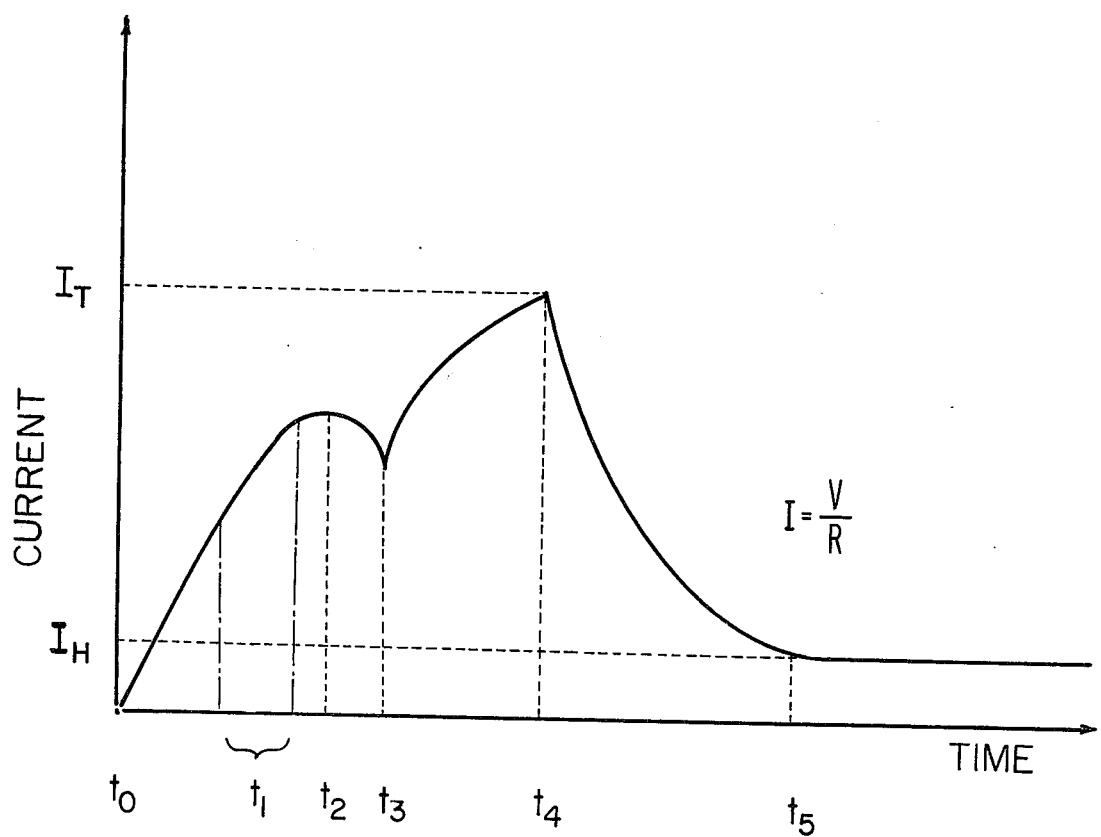
FIG. 2 represents a plot of current vs. time for a typical solenoid energization and de-energization cycle.

A typical solenoid drive circuit and the characteristic current waveform therefor are shown in FIGS. 1 and 2. In FIG. 1, a solenoid 11 has one end connected to a +24 volt D.C. source of potential and its other end connected to a switching transistor 13 through a series sensing resistor 15. When an external control circuit applies a signal to the base of transistor 13 and causes it to switch to a conductive state, a series current path will exist from the +24 volt D.C. source of potential through the solenoid 11, the series sensing resistor 15 and the transistor 13 to ground. A node 12 exists between the current sensing resistor 15 and the collector of transistor 13 and this node is connected to the anode of a diode 14 whose cathode is coupled to the end of the solenoid 11 which is connected to the +24 volt source of D.C. potential. The node 12 is also connected to the collector of a second switching transistor 16 through a holding current-establishing resistor 18. The transistor 16 is switched to a conductive state when transistor 13 is so-switched and operates to establish a level of holding current after the transistor 13 is switched to a non-conductive state. The diode 14 is added to form a current loop through the solenoid and the sensing resistor after the switching transistor 13 has been switched to a non-conductive state. A voltmeter 17 is connected across the sensing resistor 15 so that voltage can be measured with respect to time.

FIG. 2 represents a plot of current vs. time where current is calculated from the formula $I = V/R$. Assuming that the transistor 13 was switched to a conductive state at time $t_o$, the current through the coil of the solenoid 11 builds and can be calculated by measuring the voltage across the known sensing resistor 15. As with any inductor, the coil of the solenoid 11 tends to resist a change in the current flowing therethrough. At some interval of time $t_1$, the current will be sufficient to cause the solenoid plunger or armature to be drawn into the coil. As the solenoid armature or plunger is drawn into the coil, the reluctance changes although the current continues to build. At some time $t_2$, the reluctance is changing faster than the current is building so that the current waveform of FIG. 2 reflects a drop in the level of current flowing through the solenoid coil and the sensing resistor 15. At time $t_3$, the solenoid armature or plunger is seated such that the reluctance is no longer changing and the current is once more free to build in the coil. This point at which the reluctance ceases to change appears as a cusp in the current waveform of FIG. 2 and occurs at time $t_3$. The current then continues to build in the coil as illustrated by the portion of the waveform between the time $t_3$ and the time $t_4$. At time $t_4$ some threshold level of current is detected by some means known in the art and the switching transistor 13 is switched to a non-conductive state. A current loop is established, however, between the solenoid coil 11, the sensing resistor 15, and diode 14. The current will decay in the coil between time $t_4$ and time $t_5$. At time $t_5$, the level of holding current which is established by the conductive state of switching transistor 16 and the magnitude of the holding current-establishing resistor 18 is reached and this level of holding current will be maintained until switching transistor 16 is switched to a non-conductive state.

After time $t_3$, it will be seen that the current continues to build in the coil although no useful work is being done since the solenoid plunger or armature is already fully seated. This increased current may generate undesirable and unwanted heat which can reduce the efficiency of the solenoid or cause damage to the solenoid coil and associated circuitry.

It will be observed from a study of the characteristic current waveform of FIG. 2, that a rapid current fluctuation or "cusp" appears at time $t_3$, and this cusp in the current waveform represents substantially the exact time at which the solenoid plunger or armature has seated and the reluctance of the system is no longer changing. Depending on the various parameters of the circuit involved and the workload applied to the solenoid plunger or armature, the point in time at which this cusp occurs will vary. It is an object of the present invention to fix the turn-off time relative to this cusp indicative of the plunger or armature having been seated so as to conserve energy, reduce power supply requirements, prevent over-heating and prolong the life of the system.

Figure 3:
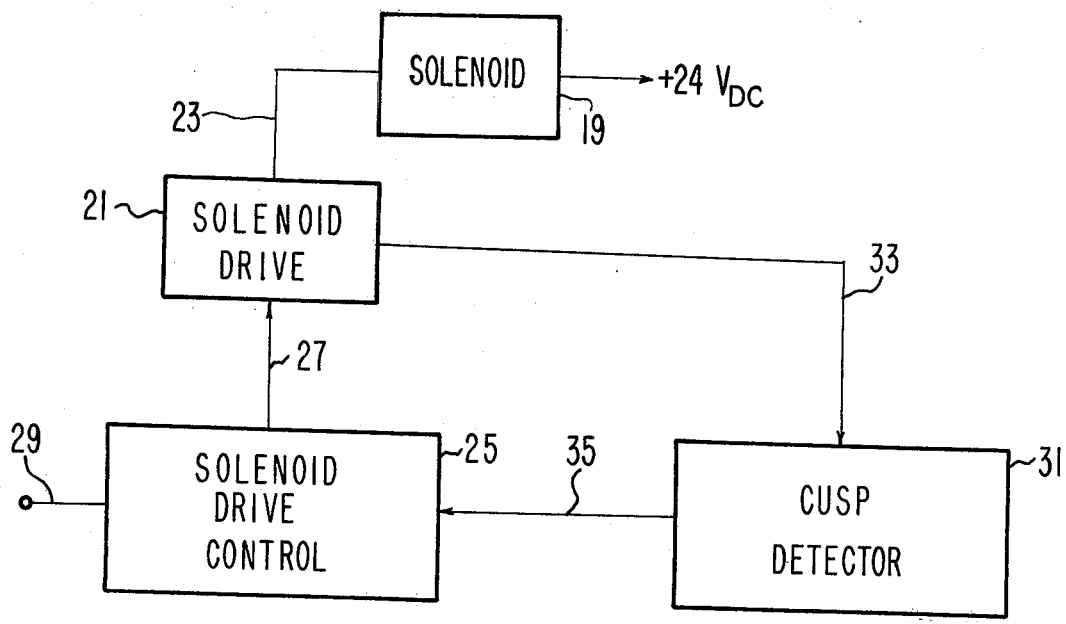
FIG. 3 represents the block diagram of the solenoid control system of the present invention.

FIG. 3 shows a block diagram of the solenoid control system of the present invention. A solenoid 19 is connected to a +24 volt source of D.C. potential and is driven by a solenoid drive circuit 21 which is connected to the solenoid 19 via lead 23. The solenoid drive circuit 21 is controlled by the solenoid drive control logic of block 25 which is coupled to the solenoid drive circuit 21 via lead 27. The solenoid drive control logic of block 25 receives a solenoid actuation signal from some external source via lead 29 which indicates a need for energizing the solenoid 19. The solenoid drive control logic 25 will respond to the external pulse and cause the solenoid drive circuit 21 to energize the solenoid 19. The cusp detector of block 31 senses the current flowing through the solenoid coil 19 via lead 33 and provides an output pulse to the solenoid drive control logic of block 25 over lead 35 when the solenoid plunger or armature of solenoid 19 has seated as indicated by the occurrence of a cusp in the waveform of the current flowing through the solenoid coil. Upon receipt of this cusp-indicative pulse, the solenoid drive control logic of block 25 will turn off the solenoid drive circuit of block 21 to de-energize the solenoid. In the event that this cusp-indicative pulse is not received by the solenoid drive control logic of block 25 within a predetermined time interval, the solenoid drive control logic of block 25 will still turn off the solenoid drive circuit of block 21 to de-energize the solenoid 19 so as to protect the circuit.

Figure 4:
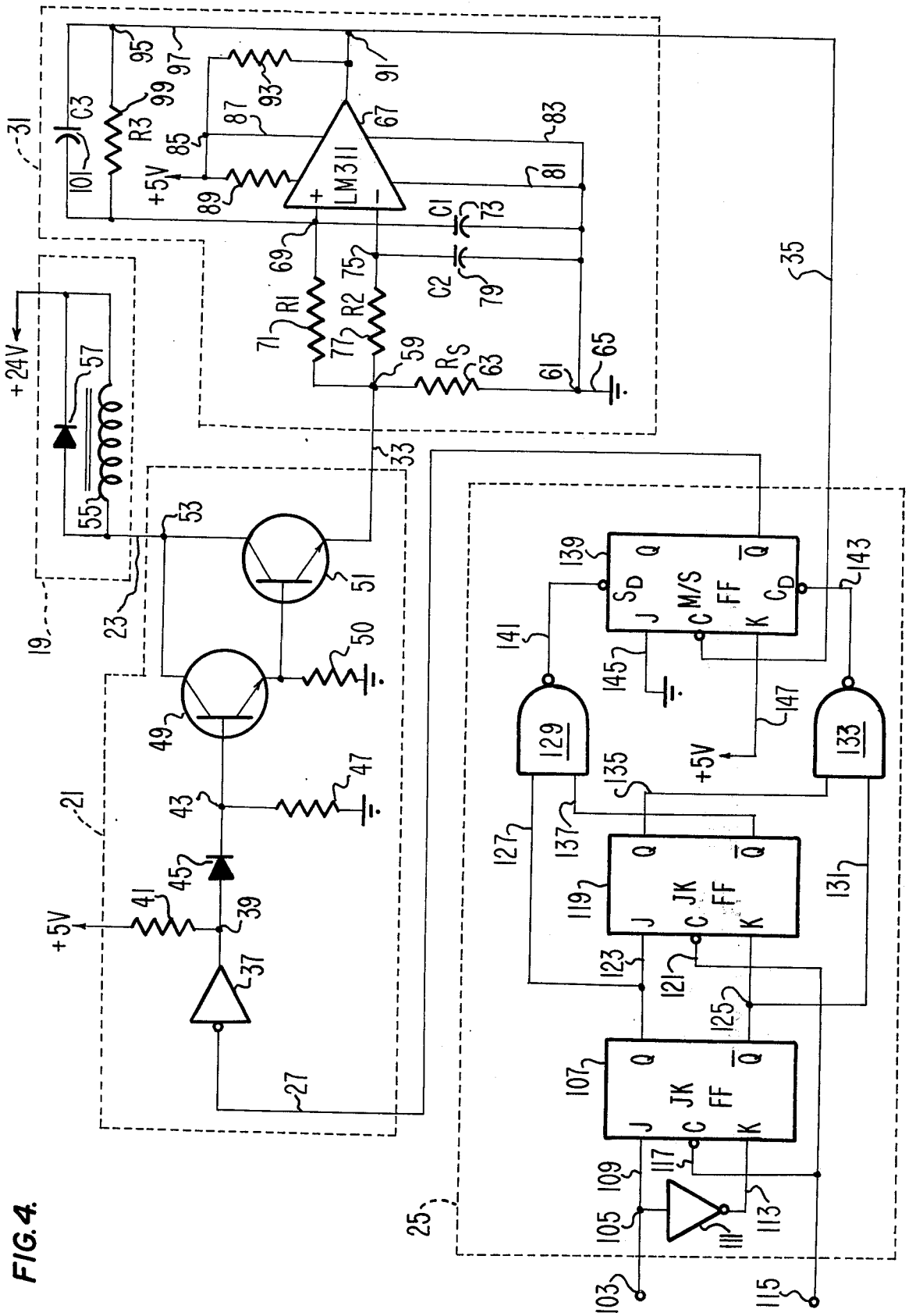
FIG. 4 illustrates a schematic diagram of the solenoid control system of the present invention and shows the details of the cusp detector circuit and the solenoid control logic of the present invention.

FIG. 4 shows a schematic diagram of the solenoid control system of FIG. 3 with each of the blocks labeled therein shown as correspondingly numbered dotted blocks in the circuit of FIG. 4. The solenoid drive circuit of block 21 receives its input from the solenoid drive control logic of block 25 via lead 27. Lead 27 is connected to the input of an inverter 37 whose output is connected to a node 39. Node 39 is connected to a +5 volt source of potential through a resistor 41 and to a node 43 through a diode 45 whose anode is connected to node 39 and whose cathode is connected to node 43. Node 43 is connected to ground through a resistor 47 and is further connected to the base of a transistor 49. The emitter of transistor 49 is connected directly to the base of a transistor 51 and is connected to ground via resistor 50. The collector of transistor 49 is connected to the collector of transistor 51 at node 53. Node 53 is coupled to the solenoid of block 19 via lead 23 and the emitter of transistor 51 is connected to the input of the cusp detector circuit of block 31 via lead 33. The solenoid of block 19 includes a solenoid coil 55 having one end coupled to input lead 23 and the other end coupled to a + 24 volt source of D.C. potential. Block 19 is shown as further including a diode 57 which is connected across the solenoid coil 55 such that its anode is connected to the input lead 23 and its cathode is connected to the +24 volt source of D.C. potential.

The cusp detector circuit of block 31 receives its input from lead 33 at input node 59. Input node 59 is coupled to a reference node 61 through a current-sensing resistor 63. The reference node 61 is coupled directly to ground through lead 65 such that when the transistor switch comprising transistor 49 and 51 are conductive, a series current path is established from the +24 volt D.C. source of potential through the solenoid coil 55, lead 23, node 53, transistors 51, 49, lead 33, node 59, the current-sensing resistor 63, node 61, and lead 65 to ground. The current-sensing resistor 63 is therefore inserted into the series current path which is used to energize the solenoid coil such that the current flowing through resistor 63 represents the current flowing through the solenoid coil 55.

The cusp detector circuitry of block 31 further includes a differential voltage comparator 67 having a pair of inputs. The first comparator input is taken from node 69 which is coupled to the input node 59 through a first comparator input resistor 71. The first comparator input node 69 is also coupled to the reference node 61 via a first comparator input capacitor 73. The combination of the first input resistor 71 and the first input capacitor 73, which are connected across the current-sensing resistor 63, has a first characteristic RC time constant. The second input to comparator 67 is taken from a second comparator input node 75 which is connected to the input node 59 via a second comparator input resistor 77 and to the reference node 61 via a second comparator input capacitor 79. The second input capacitor provides some noise immunity but could be eliminated under certain conditions. The second input resistor 77 and the second input capacitor 79 are coupled across the current-sensing resistor 63 and have a second characteristic RC time constant which is different from the RC time constant of the first input resistor 71 and the first input capacitor 73. The first input resistor-capacitor combination 71, 73 forms a ratio with the second input resistor-capacitor combination 77, 79 such that the two combinations respond to the changes in the voltage dropped across current-sensing resistor 63 as the current in the solenoid coil 55 and in the sensing resistor 63 vary to establish a varying differential input voltage between input nodes 69 and 75 of the comparator 67. The values of the capacitors 73, 79 and/or of the resistors 71, 77 could be varied to obtain varying degrees of accuracy over different ranges of operation as known in the art.

The negative power supply inputs of comparator 67 are connected to the reference node 61 via leads 81 and 83 respectively. The positive power supply inputs of comparator 67 are coupled to node 85 via lead 87 and via an offset-establishing resistor 89 respectively. Node 85 is connected to a +5 volt D.C. source of potential. The output of the comparator 67 is taken from the output node 91. Output node 91 is connected to node 85 via resistor 93; is connected to the input of the solenoid drive control logic of block 25 via lead 35; and is connected to a positive feedback network node 95 via lead 97. A positive feedback network is connected between the feedback node 95 and the first comparator input node 69 and comprises the parallel combination of a relatively large magnitude feedback resistor 99 and a feedback capacitor 101. The feedback network provides hysteresis and reduces the system's susceptibility to noise.

The solenoid drive control logic of block 25 has three inputs and a single output. A first input 103 receives the set and positive reset pulse from the external system indicating a need for energizing solenoid 19. This input is connected to an input node 105 which is connected to the "J" input of a JK flip-flop 107 via lead 109 and to the "K" input of JK flip-flop 107 via inverter 111 and lead 113. The second input to the solenoid drive control logic of block 25 is taken from input 115 which receives a series of clock pulses from a source of clock pulses such as a 250 KC master clock not shown but well-known in the art. These clock pulses are supplied from the input 115 to the clock input of JK flip-flop 107 via lead 117 and to the clock input of a second JK flip-flop 119 via clock input lead 121. The "Q" output of JK flip-flop 107 is taken from node 123 and is connected directly to the "J" input of JK flip-flop 119. The "Q" output of JK flip-flop 107 is taken from node 125 and supplied directly to the "K" input of JK flip-flop 119. The node 123 is also connected via lead 127 to one input of a NAND gate 129 and the node 125 is connected via lead 131 to one input of a second NAND gate 133. The "Q" output of JK flip-flop 119 is connected to the second input of NAND gate 133 via lead 135 and the "Q" output of JK flip-flop 119 is connected to the second input of NAND gate 129 via lead 137. The output of NAND gate 129 is connected to the "dominant set" input of a master/slave JK flip-flop 139 via lead 141 and the output of NAND gate 133 is connected to the "dominant clear" input of master/slave JK flip-flop 139 via lead 143. The "J" input of the master/slave JK flip-flop 139 is connected directly to ground via lead 145 and the "K" input of master/slave JK flip-flop 139 is connected to a +5 volt source of potential via lead 147. The third or clock input of master/slave JK flip-flop 139 is taken from the output of the cusp detector circuit of block 31 via lead 35 and the "Q" output of master/slave JK flip-flop 139 is used as the sole output of the solenoid drive control logic of the present invention and is connected to the input of the solenoid drive circuit of block 21 via lead 27.

Figure 5:
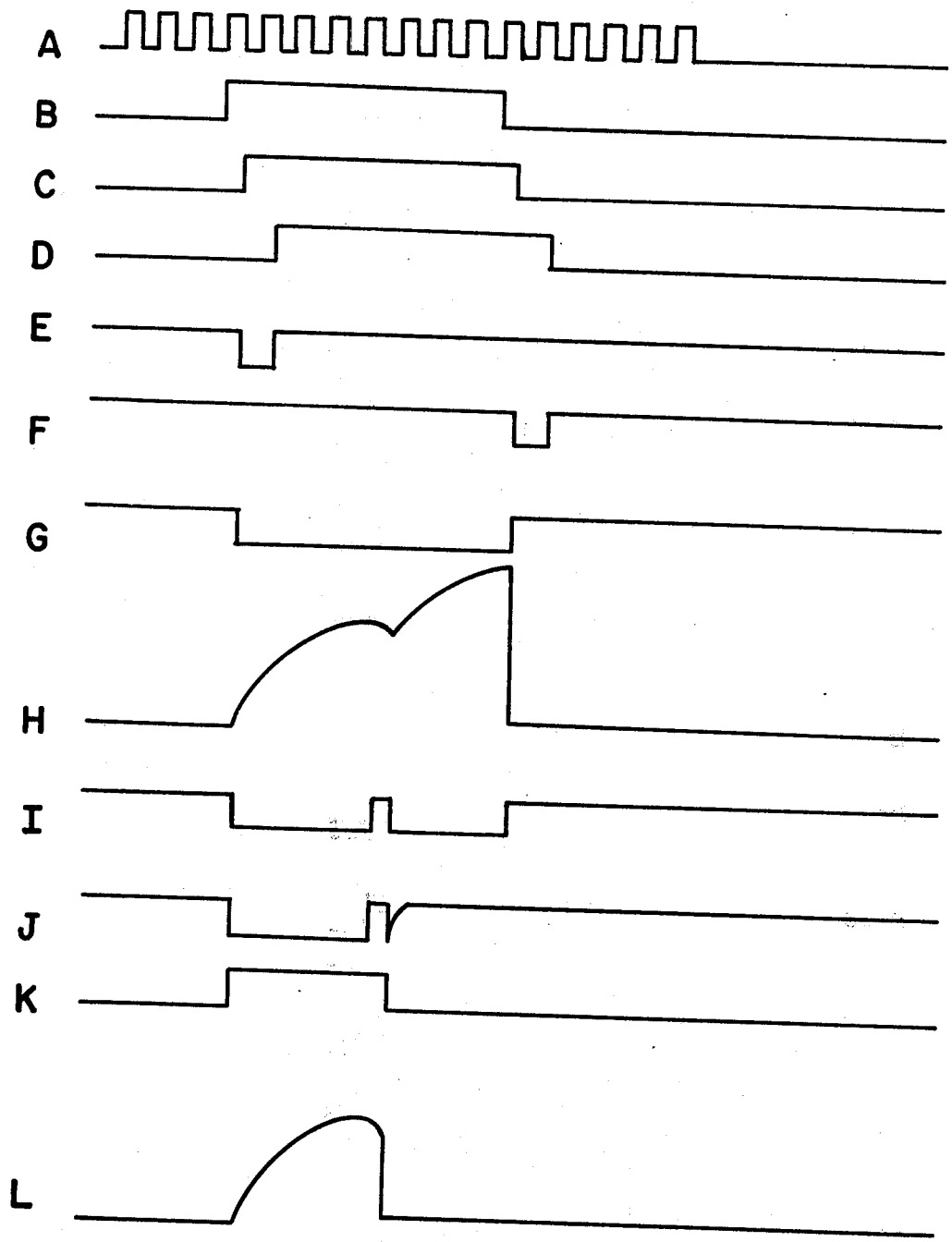
FIG. 5 shows a timing diagram which will be referred to in explaining the operation of the circuit of FIG. 4.

FIG. 5 shows a timing diagram which is helpful in explaining the operation of the circuit of FIG. 4. The various pulse trains or lines of the timing diagram of FIG. 5 are labeled A–L. Line A illustrates a pulse train of clock pulses such as might be supplied to input 115 of the solenoid control logic of block 25. The pulse on line B represents the positive-going "set" pulse which would be supplied to input 103 from some external source to indicate that the solenoid 19 is energized. Line C represents the "Q" output of JK flip-flop 107 and line D represents the "Q" output of JK flip-flop 119. The negative-going pulse on line E represents the output of NAND gate 129 and the negative-going pulse on line F represents the output of NAND gate 133. The pulse on line G represents the "Q" output of master/slave JK flip-flop 139 for a situation wherein no cusp was detected or, for one reason or another, no cusp-indicative pulse was received by the solenoid control logic of block 25 via lead 35.

Line H of the timing diagram of FIG. 5 shows the waveform of the current through the sensing resistor 63 for the situation wherein lead 35 is disconnected from the solenoid control logic of block 25 such that a cusp-indicative pulse from the output of comparator 67 is not received within the predetermined time interval (the time between the pulses on lines E and F) such that the solenoid coil 55 is de-energized only at the end of that predetermined time interval. The waveform on line I represents the output appearing at output node 91 of the cusp-detector for the case wherein the lead 35 is disconnected from the solenoid control logic of block 25 so that the cusp-indicative pulse is not used to de-energize the solenoid. The waveform of line J represents the pulse train seen at the clock input of the master/slave JK flip-flop 139 for the situation wherein the lead 35 is connected to the third or clock input of the flip-flop and supplied with the cusp-indicative pulse from the output of the comparator 67. The second time that the waveform of line J goes negative and then quickly rises to go positive once more has been exaggerated somewhat in order to show that it goes negative and then again quickly positive rather than continuing as a straight positive pulse, but in actuality this occurs in so brief a time that it would normally be imperceptible. The pulse on line K represents the signals seen at the "Q" output of master/slave JK flip-flop 139 of the solenoid control logic of the present invention wherein the cusp-indicative pulse is received via lead 35 during the predetermined time interval, and the waveform on line L represents the current through the sensing resistor 63 for the case in which the cusp-indicative pulse is fed to the solenoid control logic of block 25 via lead 35 and used to turn off the solenoid drive circuit 21 and de-energize the solenoid coil 55 of block 19.

Figure 6:
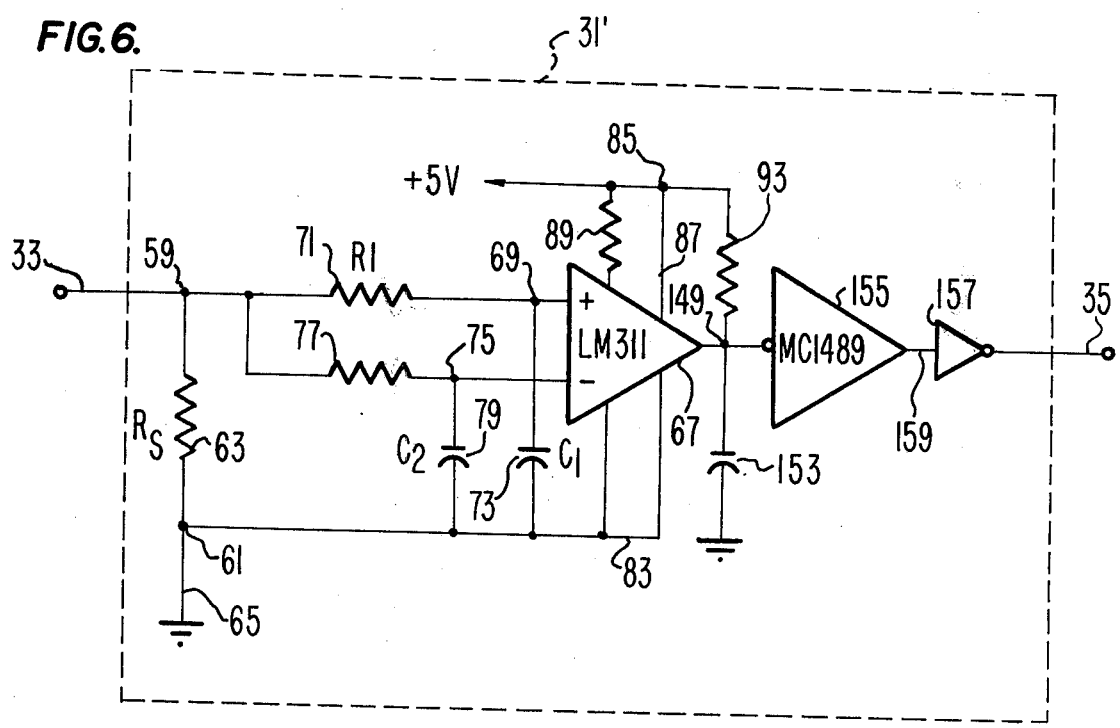
FIG. 6 shows a circuit diagram of an alternate embodiment of the cusp detector of block 31 of FIG. 4.

FIG. 6 represents an alternate embodiment to the cusp detector of the present invention. The configuration of the comparator and the ratio-establishing inputs therefor are substantially as shown in FIG. 4 and the outputs have been modified to eliminate the feedback network comprising feedback resistor 99 and feedback capacitor 101 and to substitute in its place the following circuit. The output of comparator 67 is taken from node 149. Node 149 is coupled through resistor 93 to the node 85 and through a capacitor 153 to ground. Node 149 is also connected to the input of a Schmitt trigger device 155 which may be, for example, an MC1489 package, known in the prior art, and which is used to provide the necessary noise immunity and hysteresis in place of the feedback network of FIG. 4. The output of the Schmitt trigger device 155 is supplied to an inverter 157 via lead 159 and the output of inverter 157 may be supplied to the solenoid control logic of block 25 via lead 35 as previously described.

The operation of the solenoid control system of FIG. 4 will now be described with reference thereto and to the timing diagram of FIG. 5.

When an external circuit or system generates a positive-going pulse to indicate the need for energizing the solenoid coil 55 of block 19, the positive pulse is supplied to input 103 and used to dominately set JK flip-flop 107 on the negative-going edge of the next master clock pulse to occur. When JK flip-flop 107 is set, the "Q" output goes "high." This high is supplied to the "J" input of JK flip-flop 119 and to one input of NAND gate 129 via lead 127. Since the other input of NAND gate 129 is connected to the "Q" output of JK flip-flop 119, and since this output is still high until the next clock pulse causes JK flip-flop 119 to set, both inputs of the NAND gate 129 are momentarily high for one clock pulse time causing a low to appear at the gate output. This low is transmitted via lead 141 to the "dominant set" input of master/slave JK flip-flop 139 causing flip-flop 139 to dominantly set. The duration of this "dominant set" pulse is sufficient to insure that the flip-flop 139 is not reset by the pulse on lead 35 which occurs as the coil is energized. When flip-flop 139 sets, the "Q" output goes low and this low pulse is supplied via lead 27 to the input of inverter 37. Inverter 37 inverts this low signal and generates a high at its output which enables the base of transistor 49 to go high causing the transistor to conduct. When transistor 49 conducts, transistor 51 is also switched to a conductive state providing a current path from the +24 volt D.C. source of potential to ground through the solenoid coil 55, the transistors 49 and 51, and the sensing resistor 63.

As the current builds in the solenoid coil 55, the current in the sensing resistor 63 is monitored by the comparator circuitry of block 31 as follows. Before the solenoid drive circuit 21 was actuated to drive the solenoid, the comparator 67 was biased via offset resistor 89 such that its output was high. When the solenoid was energized and current began to flow through the sensing resistor 63, the change in the current through the sensing resistor 63 is monitored by the ratio of resistor 71 and capacitor 73 to resistor 77 and capacitor 79. The combination of resistor 71 and capacitor 73 has a different RC time constant from the combination of resistor 77 and capacitor 79 so that the ratio will establish a differential voltage between input node 69 and input node 75 of the comparator 67. As soon as current begins to flow through the sensing resistor 63, the ratio-establishing network at the input of the comparator 67 causes the output at node 91 to go low. The current through the solenoid coil 55 continues to build until the solenoid coil causes the solenoid plunger to be pulled in. As the plunger is pulled in and the air gap decreases, the change in reluctance will cause the current to begin to fall since the reluctance is changing at a rate faster than the rate at which current can be built in the coil. At the instant that the current through the sensing resistor 63 begins to fall, indicating the change in reluctance, the input ratio network will sense the change and cause the output of comparator 67 to go high. As soon as the solenoid plunger is seated, the reluctance is no longer changing and the cusp which is shown in FIG. 5H appears as the current through the sensing resistor 63 once again begins to build. But, the ratio input network again senses that the current through the sensing resistor is beginning to increase and causes the output of the comparator 67, as taken from node 91, to go low once more. This transition, from a low to a high to a low, produces a cusp-indicative pulse which is supplied via lead 35 to the clock input of master/slave JK flip-flop 139. The signal at the clock input will reset the flip-flop 139 since a +5 volt source is provided to the "K" input via lead 147. A high will then appear at the "Q" output of JK flip-flop 139 which is supplied via lead 27 to inverter 37 and inverted to supply a low signal to the base of transistor 49 thereby shutting off the switching transistors 49 and 51 and de-energizing the solenoid coil 55 by opening the current path. As soon as the transistors 49 and 51 are shut off, the current in sensing resistor 63 ceases to flow and the ratio-establishing RC network of the comparator 67 once more causes output node 91 to go high.

It will, therefore, be observed that the turn-off time of the solenoid is fixed at a predetermined interval of time after the occurrence of the cusp which appears in the current waveform indicating that the solenoid plunger has seated and the change in reluctance is over.

In the event that the cusp is not detected by the cusp-detector 31, as may occur when the solenoid plunger or armature becomes stuck or the like, the trailing edge of the "set" pulse on line B of FIG. 5 will cause JK flip-flop 107 to reset which in turn causes JK flip-flop 119 to reset. Just before JK flip-flop 119 resets, both inputs of NAND gate 133 are high causing a low to appear at the output of NAND gate 133. This low is supplied to the "dominant clear" input of master/slave JK flip-flop 139 via lead 143. This pulse causes JK flip-flop 139 to be reset and a "high" to appear at the "Q" output. This high is transmitted via lead 27 to inverter 37 of the solenoid driver circuit of block 21 causing the transistors 49 and 51 to be switched to a non-conductive state thereby de-energizing the solenoid. This is done to prevent the continued increase of current in the coil 55 which, after the cusp occurs, indicating that the plunger has seated, wastes energy and generates potentially harmful heat which could burn up the coil or otherwise damage associated circuitry.

The cusp detector circuit of block 31 employs a feedback network comprising the parallel combination of feedback resistor 99 and feedback capacitor 101. This positive feedback network locks the comparator to its present state thereby providing a hysteresis effect and reducing the susceptibility to noise of the system. If the system were free to oscillate or were susceptible to noise, the resulting unreliable outputs would render the circuit unusable. In the alternate embodiment of the cusp detector which is shown in FIG. 6, the feedback capacitor and feedback resistor is eliminated but the Schmitt trigger device 155 has been added to provide the necessary hysteresis effect and the necessary noise immunity.

Under normal operation the circuit of FIG. 4 will operate to initiate the energization of the solenoid coil 55 in response to the presence of a "set" pulse at input 103. The current through the solenoid coil will build and the cusp will appear in the current waveform at the point in time at which the solenoid plunger seats. The cusp detector of block 31, and more particularly the comparator 67, will monitor the current through the sensing resistor 63 and sense the altering voltages at the inputs 69 and 75, as dictated by the RC input ratio-establishing networks and cause the output of the cusp detector to generate a pulse when the solenoid plunger is seated and the cusp has occured. This signal causes the solenoid control logic of block 25 to generate a signal causing the transistors 49 and 51 to switch to a non-conductive state and de-energize the solenoid coil 55. In the event that the cusp is not detected, there will be no cusp-indicative pulse arriving on lead 35 to the clock input of JK flip-flop 139, but at the end of the predetermined interval of time, which is determined by the duration of the set pulse appearing at the input 103, NAND gate 133 will generate a negative-going pulse to reset master/slave JK flip-flop 139 causing the transistors 49 and 51 to be switched to a non-conductive state thereby de-energizing the solenoid coil so as to minimize the excessive generation of heat, and protect the solenoid coil and related circuitry.

Table I below illustrates representative component values utilized in a typical embodiment of the present invention as set forth in claim 4. These values are meant to be representative only and in no way constitute any limitation on the present invention.

TABLE I

| Component | | Value or Designation |
|---|---|---|
| Comparator | 67 | LM 311 |
| Schmitt Device | 155 | MC 1489 |
| NAND Gates | 129 & 133 | DTL 946 |
| Inverter | 37 | DTL 944 |
| Inverters | 111 & 157 | DTL 936 |
| Coil | 55 | 3.4 ohms |
| Resistor | 41 | 270 ohms |
| Resistor | 47 | 1000 ohms |
| Resistor | 50 | 51 ohms |
| Resistor | 63 | 0.10 ohms |
| Resistors | 71, 77 & 92 | 2000 ohms |
| Resistor | 89 | 10,000 ohms |
| Resistor | 99 | $2 \times 10^6$ ohms |
| Capacitors | 73 & 153 | 0.1 microfarad |
| Capacitor | 79 | 0.012 microfarad |
| Capacitor | 101 | 0.005 microfarad |

Although specific apparatus has been shown for the purpose of describing applicants' invention, it will be apparent to those skilled in the art that other variations and modifications in the specific structure illustrated may be made without departing from the spirit and scope of the present invention which is limited only by the appended claims.

We claim:

1. A solenoid control system comprising:
    a solenoid including a solenoid coil and a solenoid armature;
    solenoid drive means for selectively energizing and de-energizing said solenoid coil;
    means for sensing the current in said solenoid coil;
    comparator means responsive to said sensing means for detecting when said solenoid armature has seated and for generating a control signal in response thereto; and
    logic control means responsive to an input pulse indicative of the need for energizing said solenoid for enabling said solenoid drive means to energize said solenoid and responsive to said control signal for disabling said solenoid drive means to de-energizing said solenoid.

2. The solenoid control system of claim 1 wherein said means for sensing the current in said solenoid coil includes a current-sensing resistor connected in a series path comprising a source of potential, said solenoid coil, said current-sensing resistor and ground and wherein said comparator means includes a comparator having first and second inputs and a comparator output.

3. The solenoid control system of claim 2 wherein said comparator means further includes means for establishing a resistor-capacitor ratio at the first and second input of said comparator, said ratio-establishing means being responsive to the voltage developed across said current-sensing resistor for supplying a differential voltage to the first and second inputs of said comparator.

4. The solenoid control system of claim 3 wherein said ratio-establishing means comprises:

first capacitor means for coupling the first input of said comparator to the grounded end of said current-sensing resistor;
a first resistor coupling said first input of said comparator to the other end of said current-sensing resistor;
second capacitive means coupling the second input of said comparator to the grounded end of said current-sensing resistor; and
a second resistor coupling the second input of said comparator to the other end of said current-sensing resistor.

5. The solenoid control system of claim 4 wherein said comparator means further includes a feedback means including the parallel combination of a third resistor and a third capacitor for reducing noise and preventing oscillations.

6. The solenoid control circuit of claim 4 wherein said comparator means further includes means coupled to the output of said comparator for providing hysteresis and increasing noise immunity.

7. The solenoid control system of claim 1 wherein said logic control means comprises:
flip-flop means for generating a first signal for enabling said solenoid drive means and a second signal for disabling said solenoid drive means;
first logic means responsive to said input pulse indicative of the need for energizing said solenoid for setting said flip-flop means and triggering the generation of said first signal;
means responsive to said control signal from the output of said comparator means for clocking the reset of said flip-flop means and triggering the generation of said second signal; and
second logic means responsive to the failure of said comparator means to generate said control signal during a predetermined time interval for clearing said flip-flop means and triggering the generation of said second signal.

8. A control system for actuating a solenoid in response to a signal indicative of an external need therefor and for deactuating said solenoid when the solenoid armature reaches a predetermined position, said control system comprising:
means for establishing a current path from a source of potential through said solenoid to ground, said path-establishing means including a bistable switching means for opening and closing said current path;
detector means responsive to the current in said current path for detecting when said solenoid armature reaches said predetermined point and for generating a control signal in response thereto; and
control means responsive to said signal indicative of an external need for triggering said bistable switching means to a first state wherein said current path is closed for energizing said solenoid and responsive to said control signal for triggering said bistable switching means to a second state and opening said current path for de-energizing said solenoid.

9. The control system of claim 8 wherein said means for establishing a current path includes a current-sensing resistor and wherein the bistable switching means included in said path-establishing means comprises a transistor switch responsive to a first switch-triggering signal at its input for closing said current path and responsive to a second switch-triggering signal at its input for opening said current path.

10. The control system of claim 9 wherein said control means comprises flip-flop means responsive to said signal indicative of an external need for supplying said first switch-triggering signal to the input of said transistor switching means and responsive to said control signal for supplying said second switch-triggering signal to the input of said transistor switching means.

11. The control system of claim 10 wherein said control means further comprises:
a first logic circuit means responsive to said signal indicative of an external need for forcing said flip-flop means to generate said first switch-triggering signal;
means responsive to said control signal for resetting said flip-flop means to generate said second switch-triggering signal; and
second logic circuit means responsive to the failure of said detector means to generate said control signal within a predetermined time interval for clearing said flip-flop means to supply said second switch-triggering signal to said transistor switch.

12. The control system of claim 9 wherein said detector means comprises:
a differential voltage comparator means having first and second inputs and a comparator output;
first resistor-capacitor means coupled across said current-sensing resistor and having a first RC time constant;
second resistor-capacitor means coupled across said current-sensing resistor and having a second and different RC time constant;
means for coupling said first and second resistor-capacitor means to the first and second inputs of said comparator means for establishing a voltage differential ratio between said inputs, and wherein the current flowing in said current-sensing resistor undergoes a characteristic fluctuation when said solenoid armature reaches said predetermined point such that said comparator means detects said characteristic current fluctuation and outputs said control signal in response thereto.

13. The control system of claim 12 wherein said detector means further includes means coupled to the output of said comparator means for providing noise immunity and preventing oscillations.

14. A cusp detector circuit comprising:
current sensing means for sensing the flow of current in a path;
differential voltage comparator means having first and second inputs and an output;
first resistor-capacitor means coupled to said first input and to said current sensing means for supplying a first level of voltage to the first input of said comparator means;
second resistor-capacitor means coupled to said current sensing means and to said second input for establishing a ratio between said first resistor-capacitor means and said second resistor-capacitor means and establishing a voltage differential between the first and second inputs of said comparator means;
feedback means coupled to the output of said comparator means for preventing oscillations and reducing noise; and
wherein said comparator means responds to a cusp in the current flowing in said current-sensing means for providing an output signal indicative thereof.

15. The cusp-detector circuit of claim 14 wherein said first resistor-capacitor means includes a first capacitor coupled between said first input of said comparator means and one end of said current-sensing means and a first resistor coupled between said first input of said comparator means and the other end of said current-sensing means; wherein said second resistor-capacitor means includes a second capacitor coupled between the second input of said comparator means and one end of said current-sensing means and a second resistor coupled between said second input of said comparator means and the other end of said current-sensing means; and wherein said feedback means includes a parallel combination of a third resistor and a third capacitor coupled between said first input of said comparator means and said comparator output.

16. An electrical circuit for detecting a fluctuation in the polarity of the slope of an analog current waveform, such as a cusp of the like, which may occur in response to change in reluctance, said detection circuit comprising:
 a current-sensing resistive means for sensing an analog current;
 a first resistor-capacitor means having a first RC time constant and a second resistor-capacitor means having a second time constant connected across said current sensing means for establishing a ratio between said first resistor-capacitor means and said second resistor-capacitor means for sensing the changes in the current flowing in said current-sensing resistive means;
 a differential voltage comparator means responsive to the differential voltage ratio established by said first resistor-capacitor means and said second resistor-capacitor means for generating an output pulse in response to a relatively rapid fluctuation in the current flowing in said current-sensing means; and
 means coupled to the output of said comparator means for reducing noise and preventing oscillations.

17. The fluctuation detection circuit of claim 16 wherein said current-sensing resistive means includes a current-sensing resistor having one end coupled to a source of current and another end coupled to ground; wherein said differential voltage comparator means includes a differential voltage comparator having a positive input, a negative input, and a comparator output; wherein said first resistor-capacitor means includes a first capacitor coupled between the positive input of said comparator and the grounded end of said current-sensing resistor and a first resistor coupled between said positive input and the non-grounded end of said current-sensing resistor; and wherein said second resistor-capacitor means includes a second capacitor coupled between said negative input and the grounded end of said current-sensing resistor and a second resistor coupled between said negative input and the non-grounded end of said current-sensing resistor.

18. The current-fluctuation detection circuit of claim 17 wherein said means for reducing noise and preventing oscillations includes a positive feedback network coupled between said comparator output and the positive input of said comparator, said feedback network including the parallel combination of a third relatively large-valued resistor and a third capacitor.

19. The current fluctuation detection circuit of claim 17 wherein said means coupled to the output of said comparator means for reducing noise and preventing oscillations comprises A Shmitt trigger device.

20. A solenoid control system wherein a bistable switching element may be selectively enabled for establishing a current path between a source of potential and through said solenoid to ground and wherein said bistable switching element may be selectively disabled to open said current path and de-energize said solenoid and wherein the waveform of the current flowing through said solenoid includes a cusp at that point in time at which the solenoid armature seats, said solenoid control system comprising:
 cusp-detector means responsive to the attainment of said cusp for generating a cusp-representative signal indicative thereof; and
 logic control means for enabling said bistable switching element to establish said current path and responsive to said control signal for disabling said switching element and opening said current path to de-energize said solenoid.

21. The solenoid control system of claim 20 wherein said cusp-detector means comprises:
 a current-sensing resistor means inserted into said current path for sensing the current flowing through said solenoid;
 comparator means having first and second inputs and a comparator output;
 a first resistor-capacitor circuit having a first RC time constant coupled across said current-sensing resistor means and further coupled to the first input of said comparator means for sensing the voltage dropped across said current-sensing resistor means;
 second resistor-capacitor circuit means having a second RC time constant coupled across said current-sensing resistor means and further coupled to said second input of said comparator means for establishing a ratio between said first resistor-capacitor circuit means and said second resistor-capacitor circuit means and establishing a differential voltage between the first and second inputs of said comparator means for detecting the occurrence of a cusp in the waveform of the current flowing through said current-sensing resistor means and causing said comparator means to generate a cusp-representative signal indicative thereof; and
 means coupled to the output of said comparator means for preventing oscillations and reducing noise.

22. The solenoid control system of claim 21 wherein said means coupled to the output of said comparator means for preventing oscillations and reducing noise includes positive feedback means coupled between said first input of said comparator means and said comparator output, said positive feedback means including the parallel combination of a third resistor and a third capacitor.

23. The solenoid control system of claim 21 wherein said logic control means comprises:
 a first flip-flop means for enabling and disabling said switching element;
 first logic circuit means responsive to a solenoid initiation command for forcing said flip-flop means to enable said bistable switching element to establish said current path;
 means responsive to said cusp-representative signal for clocking said flip-flop means and resetting its output to disable said bistable switching element and open said current path; and second logic circuit means responsive to the failure of said cusp-detector means to generate said cusp-representative signal within a predetermined time interval for clearing said flip-flop means and disabling said bistable switching element to open said current path.

24. An electrical circuit for detecting a change in the polarity of the slope of a current waveform comprising:
a current-sensing resistive means for passing electrical current;
a first resistor-capacitor means having a first RC time constant;
a second resistor-capacitor means having a second and different RC time constant;
means for coupling said first and second resistor-capacitor means in parallel across said current-sensing resistive means and establishing a differential voltage ratio between said first resistor-capacitor means and said second resistor-capacitor means for sensing variations in the current flowing in said resistive means such that a ratio of a first polarity is established when the current flowing in said resistive means is increasing and a ratio of the opposite polarity is established when said current flowing in said resistive means is decreasing;
a differential voltage comparator means coupled to said first and second resistor-capacitor means and responsive to said differential voltage ratio established thereby for generating a first electrical signal in response to the establishment of a differential voltage ratio of said first polarity and for generating a second electrical signal in response to the establishment of a differential voltage ratio of said opposite polarity; and
means coupled to the output of said comparator means for reducing noise and providing hysteresis.

* * * * *

UNITED STATES PATENT OFFICE
CERTIFICATE OF CORRECTION

Patent No. 3,946,285              Dated March 23, 1976

Inventor(s) Jack Beery and Daniel A. Wisner

It is certified that error appears in the above-identified patent and that said Letters Patent are hereby corrected as shown below:

Col. 6, line 49, should read "the "$\bar{Q}$" output";
        line 67, should read "the "$\bar{Q}$" output".
Col. 7, line 30, should read "the "$\bar{Q}$" output".
Col. 8, line 2, should read "the "$\bar{Q}$" output of JK";
        line 13, should read "the "$\bar{Q}$" output".
Col. 9, line 21, should read "at the "$\bar{Q}$" output".

Signed and Sealed this

*eighth* Day of *June 1976*

[SEAL]

Attest:

RUTH C. MASON
*Attesting Officer*

C. MARSHALL DANN
*Commissioner of Patents and Trademarks*